United States Patent
Wong et al.

(10) Patent No.: US 7,495,509 B2
(45) Date of Patent: Feb. 24, 2009

(54) AUDIO POWER AMPLIFIER

(75) Inventors: Shiah Siew Wong, Singapore (SG); Jing Sun, Singapore (SG)

(73) Assignees: Panasonic Corporation Co., Ltd., Osaka (JP); Panasonic Semiconductor Asia PTE, Ltd., Singapore (SG)

( * ) Notice: Subject to any disclaimer, the term of this patent is extended or adjusted under 35 U.S.C. 154(b) by 271 days.

(21) Appl. No.: 11/567,431

(22) Filed: Dec. 6, 2006

(65) Prior Publication Data

US 2008/0136519 A1    Jun. 12, 2008

(51) Int. Cl.
H03F 3/38    (2006.01)
H03F 3/217   (2006.01)
H03F 1/52    (2006.01)

(52) U.S. Cl. .......................... 330/10; 330/51; 330/251; 330/298

(58) Field of Classification Search .................... 330/10, 330/51, 207 A, 207 P, 251, 298
See application file for complete search history.

(56) References Cited

U.S. PATENT DOCUMENTS 4,427,951 A * 1/1984 Amada et al. ............... 330/298

7,170,339 B2 * 1/2007 Saito et al. ..................... 330/10

FOREIGN PATENT DOCUMENTS

| JP | 58-081311 | 5/1983 |
| JP | 4-108204  | 4/1992 |
| JP | 5-039095  | 5/1993 |

OTHER PUBLICATIONS

English Language Abstract of JP 4-108204. Apr. 9, 2002.
English Language Abstract of JP 58-081311. May 16, 1983.
U.S. Appl. No. 11/465,152, to Wong et al., filed Aug. 17, 2006.
U.S. Appl. No. 11/536,221, to Higuchi et al., filed Sep. 28, 2006.

* cited by examiner

*Primary Examiner*—Steven J Mottola
(74) *Attorney, Agent, or Firm*—Greenblum & Bernstein, P.L.C.

(57) ABSTRACT

A smart protection circuit to prevent possible circuit malfunction or damage due to sudden power source voltage fluctuation is introduced. In case of quick and large voltage fluctuation in power supply, a control signal is activated to stop power transistor switching. When power supply is stable at a lower or higher operating voltage, the switching circuit is able to return to normal operation.

8 Claims, 5 Drawing Sheets

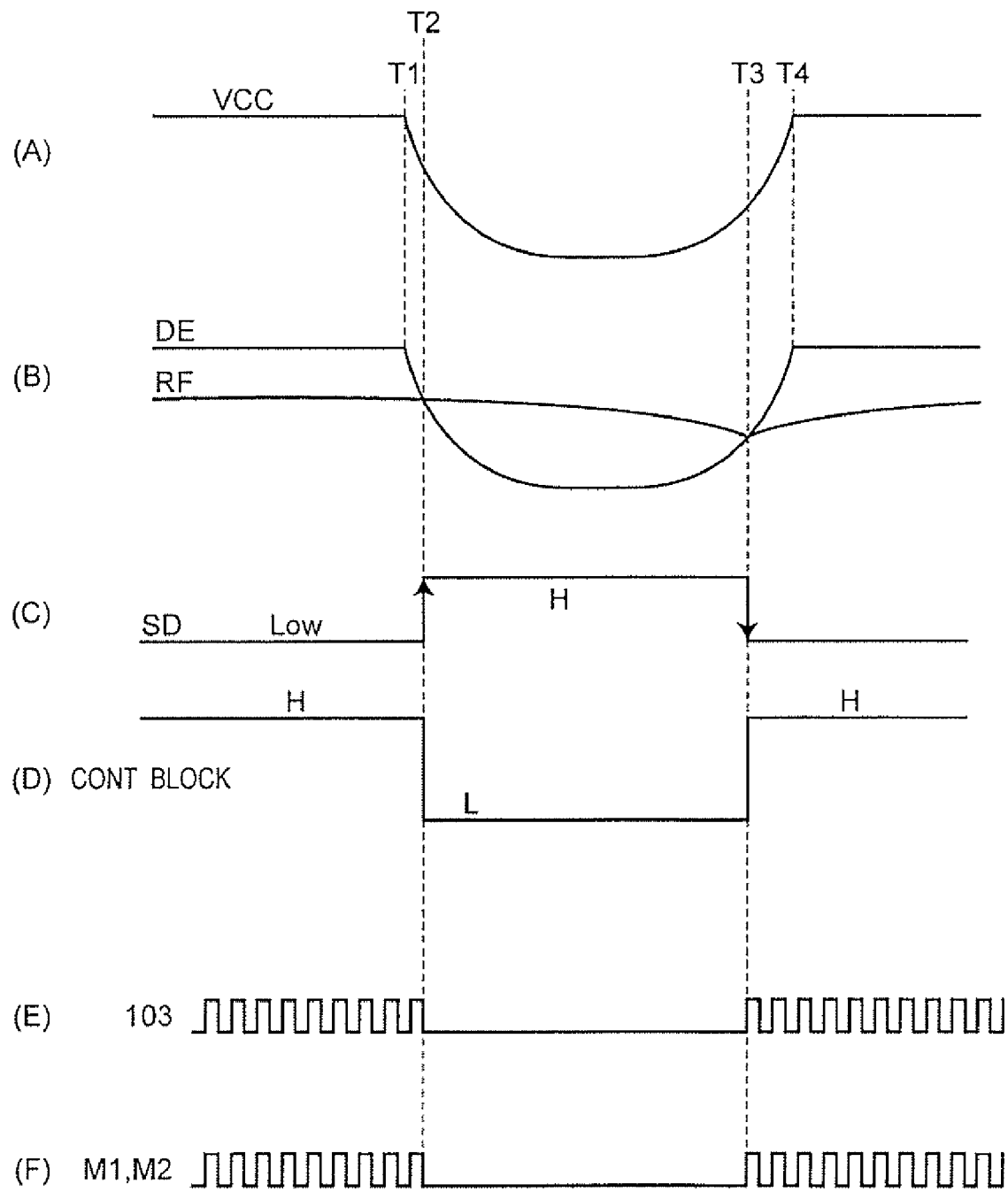

AUDIO POWER AMPLIFIER

BACKGROUND OF THE INVENTION

The present invention relates to an audio power amplifier and, more particularly, to a protection circuit for protecting a switching circuit from possible malfunction or damage due to sudden power source voltage fluctuation.

Class D audio power amplifier is one type of switching circuit. Therefore, Class D audio power amplifier is chosen for illustration purpose. Most of the audio power amplifiers in the market are based on Class AB amplifier. This architecture offers very good total harmonic distortion plus noise (THD+N) performance, with fairly low quiescent current. However, the Class AB push-pull amplifiers are very inefficient and can only achieve an efficiency of about 60%, which results in not only power loss, but also additional bulky heatsink attached to the power amplifiers.

One major advantage of Class D amplifiers is the efficiency, which could reach above 90%. The high efficiency is achieved by full signal swing at power transistors. A typical Class D amplifier circuit 1000 is shown in FIG. 1, which includes a reference (herein after also indicated as RF) circuit 1020, a pulse width modulator 1010, a level shifter and driver stage 1030, a first MOSFET switch M10, and a second MOSFET switch M20.

In the actual usage of Class D amplifier circuit 1000, the power source voltage Vcc may fluctuate suddenly and abnormally. Such sudden voltage fluctuation is due to, for example, transformer malfunction on a printed circuit board (PCB), power supply trace shorting to ground on PCB or other scenarios. If such sudden voltage fluctuation should occur, Class D amplifier circuit 1000 is damaged or performs abnormal operation.

To prevent Class D amplifier circuit 1000 from possible damaging or malfunction due to sudden power source voltage Vcc fluctuation, a protection circuit is necessary.

The following prior art references are known.
1) Japanese Utility Model Laid-Open Publication No. H5-39095 Published May 25, 1993
2) Japanese Patent Laid-Open Publication No. H4-108204 Published Apr. 9, 1992
3) Japanese Patent Laid-Open Publication No. S58-81311 Published May 16, 1983

SUMMARY OF THE INVENTION

The purpose of the present invention is to introduce an audio power amplifier with a protection circuit for sudden power source voltage fluctuation.

According to the present invention, an audio power amplifier comprises: a power source terminal which receives a power source voltage; a first and second switching transistors connected in series to said power source terminal, an audio signal passage which sends a pulse width modulation drive signal to said first and second switching transistors; a reference circuit which is connected to the power source terminal and generates a predetermined reference voltage RF; a capacitor which stores the reference voltage RF; a source voltage detection circuit which is connected to the power source terminal and generates a predetermined detected voltage DE which is proportional to the power source voltage; a comparator which compares the reference voltage RF and the detected voltage DE, and generates a fluctuation signal when the detected voltage DE falls below the reference voltage RF; and a disabling element which operates in response to the fluctuation signal to stop the operation of said first and second switching transistors.

As apparent from the above, the audio power amplifier according to the present invention comprises a source voltage detection circuit and a disabling element. The source voltage detection circuit is designed to detect, not only a sudden voltage jump, but also a sudden voltage drop of power supply. Upon detection of sudden voltage drop at power supply, a fluctuation signal is generated by the source voltage detection circuit. After receiving the fluctuation signal SD, the disabling element stops output power transistors from switching. When the power supply at the power source terminal is stable for a predetermined period, the fluctuation signal SD is deactivated by the detection circuit. The disabling element therefore allows output power transistors to resume switching and normal operation continues.

EFFECT OF THE INVENTION

According to the present invention, an audio power amplifier which can detect, not only a sudden voltage jump, but also a sudden voltage drop of power supply can be achieved with a simple structure by adding a source voltage detection circuit and a disabling element.

According to the present invention, a sudden voltage drop can be detected with a high accuracy.

According to the present invention, when the sudden voltage drop is detected, the disabling element disables the first and second switching transistors to operate, enabling no sound output. Thus, the user will not be annoyed by the unpleasant fluctuating sound.

BRIEF DESCRIPTION OF THE DRAWINGS

FIG. 5 is a chart showing waveforms obtained at major points in the block diagram of FIG. 4;

DETAILED DESCRIPTION OF THE PREFERRED EMBODIMENTS

The following description explains the best mode embodiment of the present invention.

First Embodiment

Figure 1:
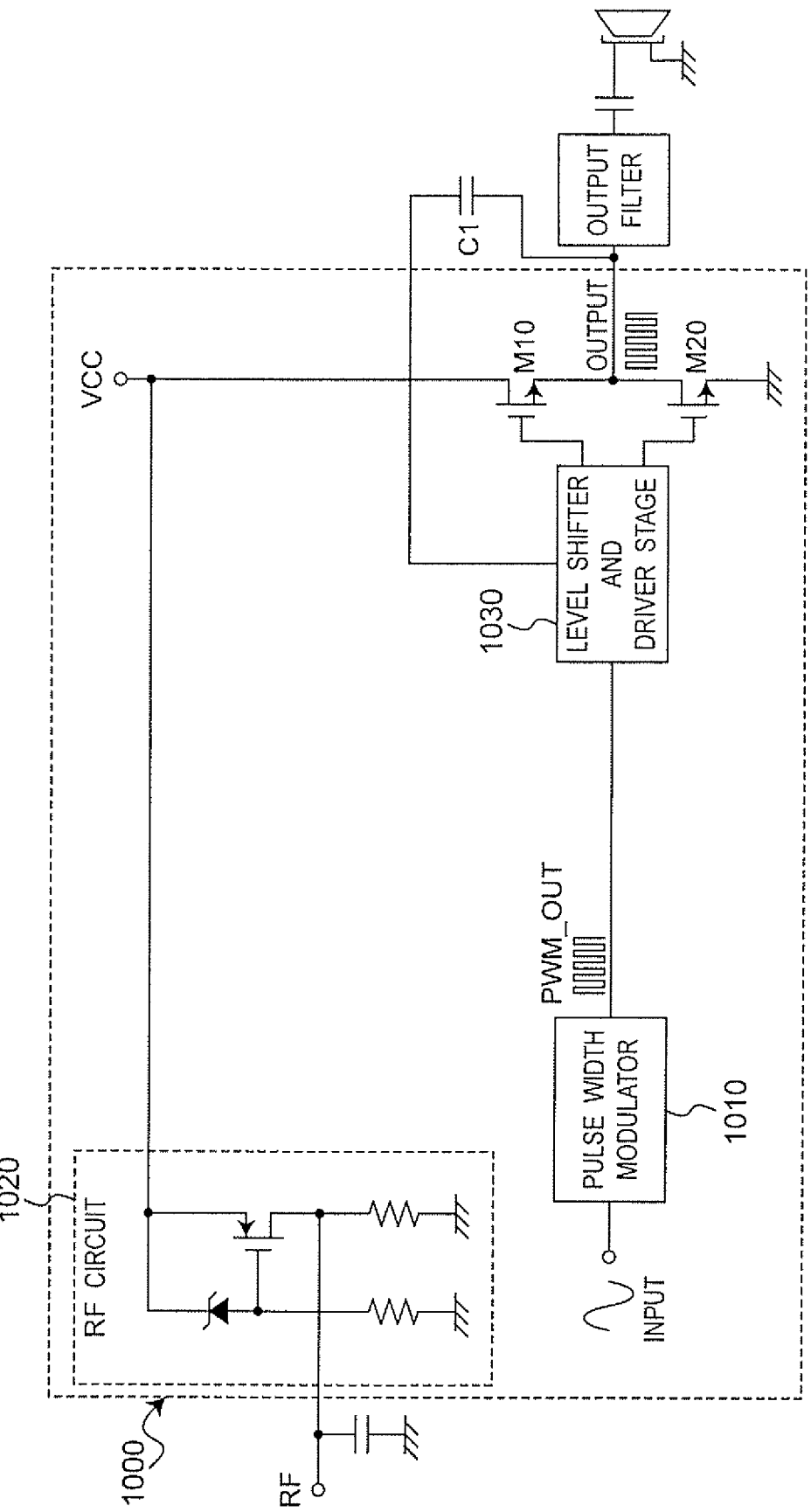
FIG. 1 is a block diagram showing an audio power amplifier according to the prior art.
Figure 2:
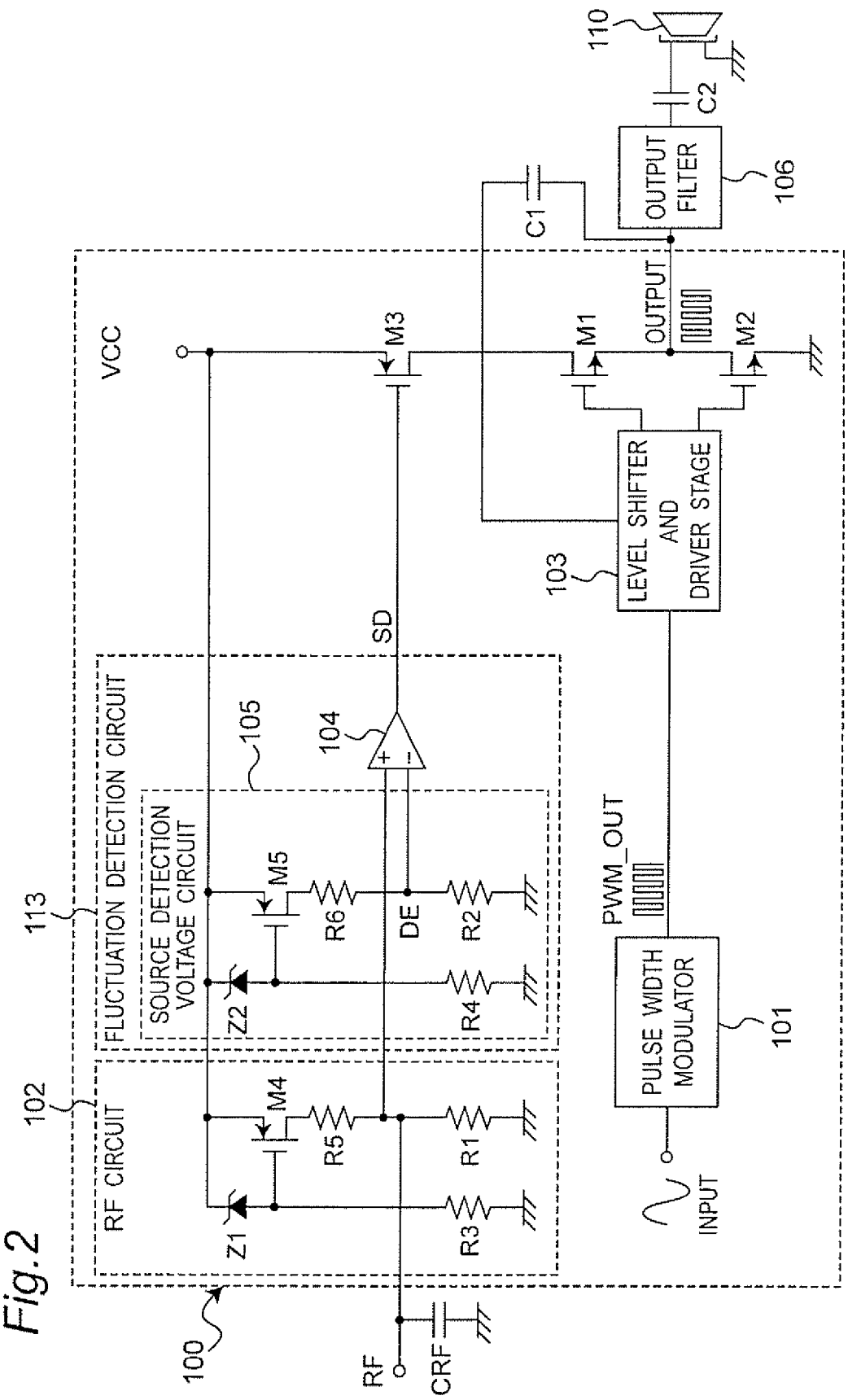
FIG. 2 is a block diagram showing an audio power amplifier according to a first embodiment of the present invention.

Referring to FIG. 2, a first embodiment of an audio power amplifier 100, which is a Class D amplifier, is shown. The audio power amplifier 100 comprises a power source terminal for receiving a power source voltage Vcc, a reference (RF) circuit 102, a pulse width modulator 101, a level shifter and driver stage 103, and first and second switching transistors, such as a first MOSFET switch M1, and a second MOSFET switch M2. The pulse width modulator 101 and the level shifter and driver stage 103 define an audio signal passage for sending a pulse width modulation drive signal (PWM drive signal) to the first and second MOSFET switches M1 and M2.

RF circuit 102 comprises a zener diode Z1, a resistor R3, a PMOS M4 and resistors R1 and R5. RF circuit 102 generates a reference voltage RF at a junction between resistors R5 and R1. Although two resistors R1 and R5 are shown as connected directly in series, resistor R5 can be connected between the power source terminal and the PMOS M4. The junction is further connected to a capacitor CRF for storing the reference voltage RF. The reference voltage RF is used as a stable reference voltage in various circuits (not shown).

According to the first embodiment, a fluctuation detection circuit 113 and a switching transistor, such as a third MOSFET switch M3, are further provided. The fluctuation detection circuit 113 detects a sudden power source voltage fluctuation, such as voltage drop of a power source voltage Vcc. Here, only a power source terminal for receiving the power source voltage Vcc is shown.

The MOSFET switches M1, M2 and M3 are provided in series between the power source voltage Vcc and the ground. The MOSFET switch M3 is located next to the voltage source Vcc, but can be located next to the ground, or between the MOSFETs M1 and M2.

The fluctuation detection circuit 113 comprises a source voltage detection circuit 105 and a comparator 104. The source voltage detection circuit 105 comprises a zener diode Z2, a resistor R4, a PMOS M5, and resistors R2 and R6. The source voltage detection circuit 113 generates a detected voltage DE at a junction between resistors R2 and R6. The detected voltage DE is proportional to the power source voltage Vcc, as apparent from FIG. 3 waveforms (A) and (B). Although two resistors R2 and R6 are shown as connected directly in series, resistor R6 can be connected between the power source terminal and the PMOS M5. Furthermore, it is possible to omit resistors R5 and R6.

It is to be noted that the first pair of zener diode Z1 and resistor R3 and the second pair of zener diode Z2 and resistor R4 have the same characteristics. Thus, the second pair (or the first pair) can be omitted. In such a case, the gate of PMOS M4 and the gate of PMOS M5 are commonly connected.

It is to be noted that resistors R11 R2, R5 and R6 are so selected that the reference voltage RF and the detected voltage DE are not the same. According to the first embodiment, the relationship between the voltages RF and DE is such that DE is greater than RF (DE>RF).

Comparator 104 compares the voltages RF and DE and generates a control signal SD based on the comparison result. Under a normal operating condition, that is when DE>RF, comparator 104 generates the control signal SD of a LOW level to allow the MOSFET switch M3 in ON state.

An application circuit provided in association with the first MOSFET switch M1 and second MOSFET switch M2 includes an output filter 106, a bootstrap capacitor C1, a decoupling capacitor C2, and a loudspeaker 110.

The operation of the audio power amplifier 100 is described next with reference to FIGS. 2 and 3.

Figure 3:
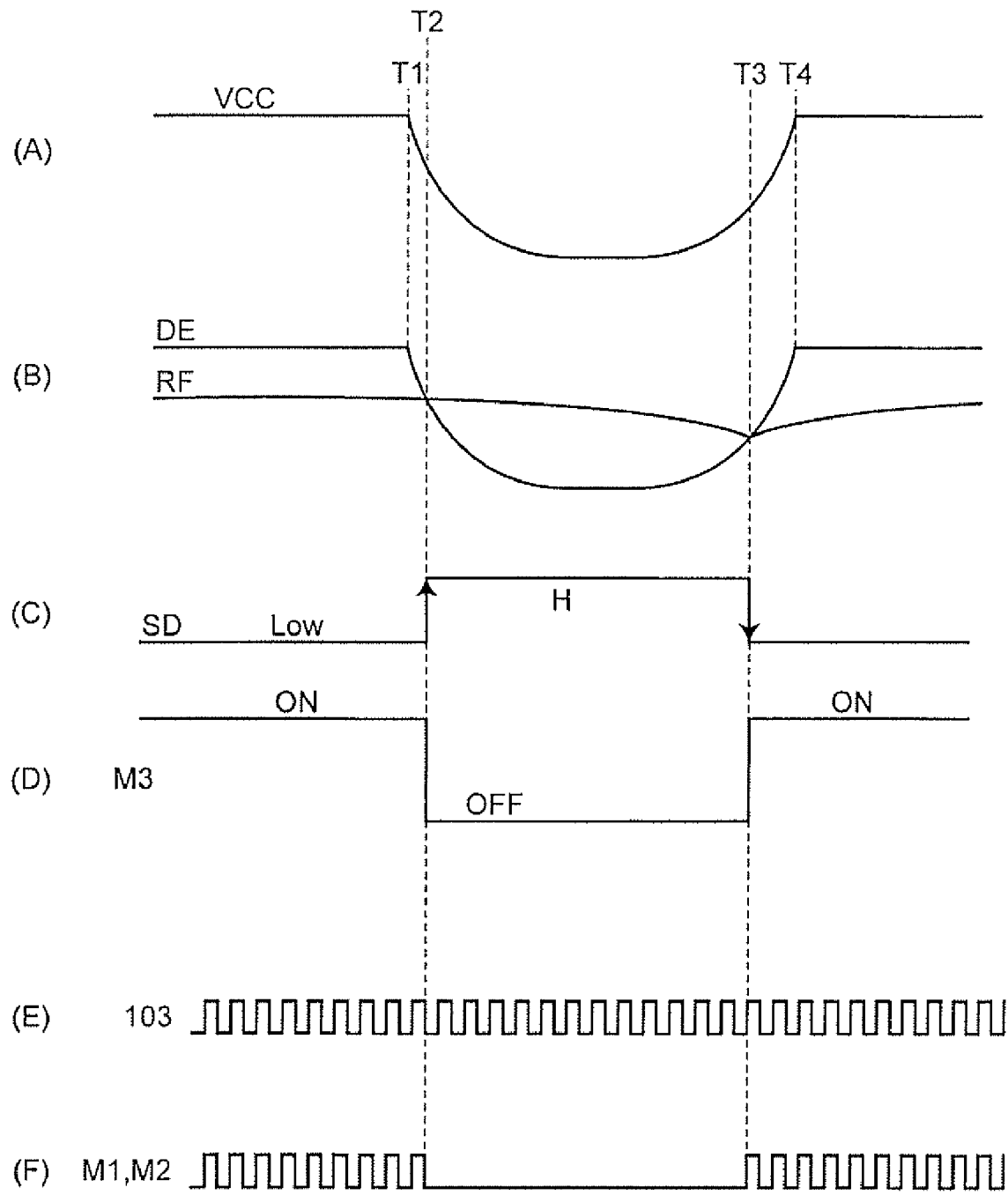
FIG. 3 is a chart showing waveforms obtained at major points in the block diagram of FIG. 2.

In FIG. 3, before time T1, the power source voltage Vcc is stable. During this time, the voltages RF and DE are such that DE is greater than RF. Thus, comparator 104 generates the control signal SD of a LOW level. Thus, MOSFET switch M3 is maintained in ON state to provide the power source voltage Vcc to MOSFET switches M1 and M2. Under this condition the pulse width modulator 101 generates the signal PWM_OUT which is applied to the level shifter and driver stage 103. The level shifter and driver stage 103 generates PWM drive signal to MOSFETs M1 and M2. Thus, MOSFETs M1 and M2 produces output PWM signal which is applied to the output filter 106. Then, by the signal from output filter 106, the speaker 110 produces sound.

In FIG. 3, at time T1, the power source voltage Vcc starts to drop due to transformer malfunction on PCB (printed circuit board) or to any other reasons. The detected voltage DE drops similarly to the supply voltage Vcc, but the reference voltage RF maintains its voltage by the charge stored in capacitor CRF.

Then, at time T2, when the detected voltage DE falls below the reference voltage RF, comparator 104 starts to generate the control signal SD of a HIGH level. Thus, MOSFET switch M3 is turned to OFF state to cut off the power source voltage Vcc to MOSFET switches M1 and M2. Under this condition the pulse width modulator 101 generates the signal PWM_OUT which is applied to the level shifter and driver stage 103. The level shifter and driver stage 103 generates PWM drive signal to MOSFETs M1 and M2. However, MOSFETs M1 and M2 are not provided with the supply voltage Vcc. Thus, the speaker 110 stops producing sound.

Then, when the power source voltage Vcc recovers, the detected voltage DE also recovers. At time T3, when the detected voltage DE increases above the reference voltage RF, comparator 104 again starts to generate the control signal SD of a LOW level. Thus, MOSFET switch M3 is turned back to ON state to restart the supply of the power source voltage Vcc to MOSFET switches M1 and M2. Thus, the speaker 110 restarts to produce sound.

The above operation is directed to a case when the power source voltage Vcc drops abnormally below a predetermined low limit voltage at a dropping speed faster than a predetermined value. Such a predetermined low limit voltage can be defined by the setting of the voltages RF and DE, i.e., by the setting of resistors R1, R2, R5 and R6.

Thus, it is understood that the control signal SD of a HIGH level can be considered as a fluctuation signal indicating that the power source voltage Vcc drops below a predetermined low limit.

According to the first embodiment, the abnormal voltage drop can be detected by the fluctuation detection circuit 113, and when abnormal voltage drop is detected, a disabling element, which is MOSFET switch M3 is operated to immediately stop the operation of MOSFETs M1 and M2 by cutting off the power supply from the power source voltage Vcc. Thus, the speaker 110 will not produce any unpleasant on and off intermittent sound, particularly when the abnormal voltage drop occurs.

Second Embodiment

Figure 4:
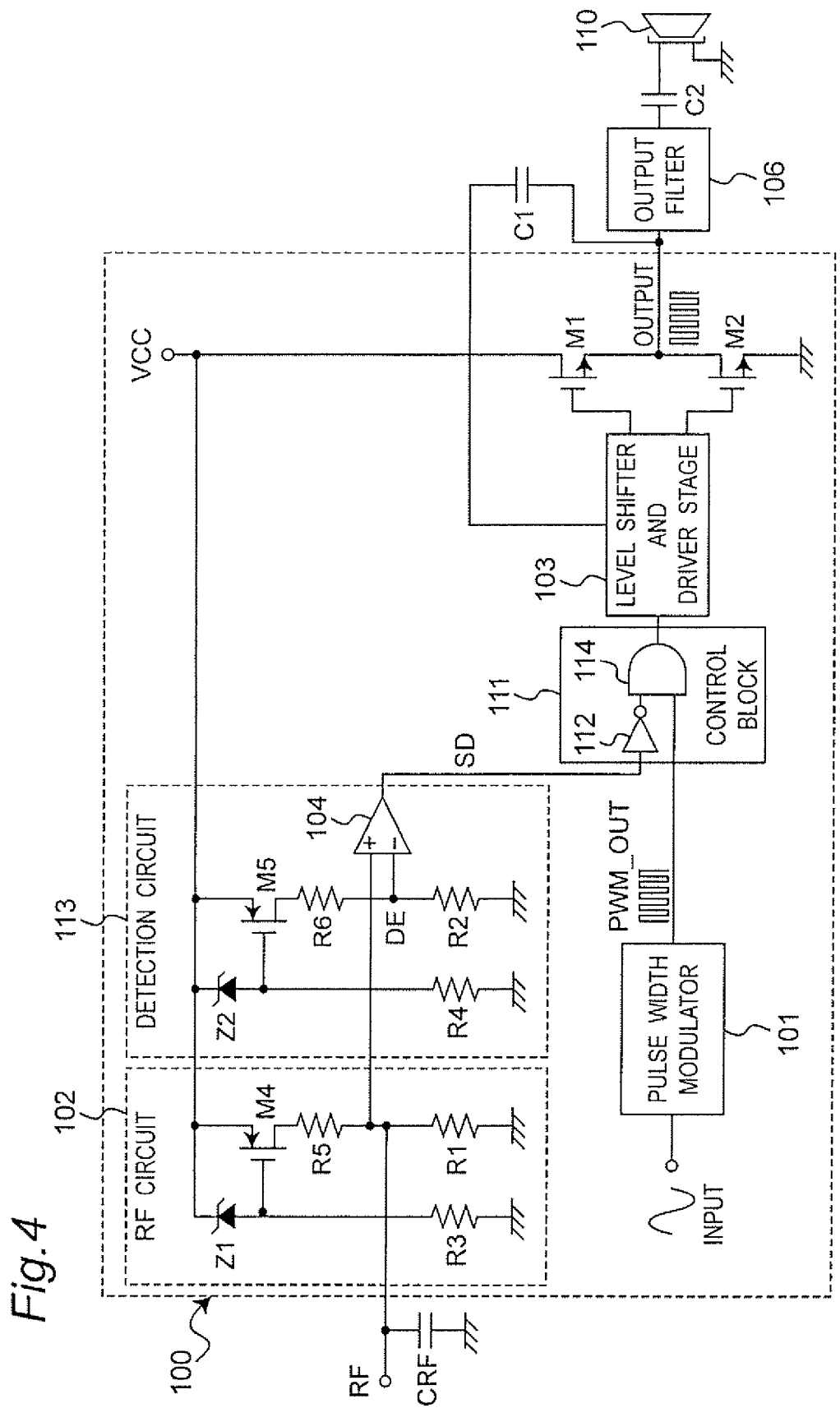
FIG. 4 is a block diagram showing an audio power amplifier according to a second embodiment of the present invention.

Referring to FIG. 4, a second embodiment of an audio power amplifier 100, which is a Class D amplifier, is shown. When compared with the first embodiment shown in FIG. 2, the audio power amplifier 100 of the second embodiment does not have the MOSFET M3, but instead a control block 111 is inserted between the pulse width modulator 101 and the level shifter and driver stage 103.

It is to be noted that the control block 111 can be inserted in upstream of the pulse width modulator 101, or in downstream of the level shifter and driver stage 103. In other words, according to the second embodiment, the control block 111 is inserted someplace in the audio signal passage.

According to the second embodiment, the control block 111 comprises an inverter 112 and an AND gate 114. The inverter 112 is connected to the comparator 104 to receive the control signal SD. The output of the inverter 112 is connected to one input of the AND gate 114. The other input of the AND gate 114 is connected to the output of the pulse width modulator 101 to receive the signal PWM_OUT. The output of the AND gate 114 is connected to the level shifter and driver stage 103. It is to be noted that the inverter 112 can be omitted when the comparator 104 produces the control signal SD in opposite phase such that the LOW level and HIGH level are in opposite phase.

In operation, at time T2 shown in FIG. 5, the control signal SD changes from LOW level to HIGH level in the same manner as that described in the first embodiment. While the control signal SD of LOW level was present (i.e., before time T2), inverter 112 produces a HIGH level signal to AND gate 114. Thus, AND gate 114 is enabled to allow the signal PWM_OUT to pass therethrough. Thus, the sound is produced from the speaker 110. Then, when the control signal SD of HIGH level is produced (i.e., between time T2 and T3), inverter 112 produces a LOW level signal to AND gate 114. Thus AND gate 114 is disabled to block the signal PWM_OUT. Thus, the sound will not be produced from the speaker 110.

The above is a case when the power source voltage Vcc drops abnormally below a predetermined low limit voltage.

According to the second embodiment, the abnormal voltage drop can be detected by the fluctuation detection circuit 113, and when such abnormal voltage drop is detected, a disabling element, which is control block 111 is operated to immediately stop the operation of MOSFETs M1 and M2 by cutting off the PWM drive signal to MOSFETs M1 and M2. Thus, the speaker 110 will not produce any unpleasant on and off intermittent sound, particularly when the abnormal voltage drop occurs.

Having described the above embodiment of the invention, various alternations, modifications or improvement could be made by those skilled in the art. Such alternations, modifications or improvement are intended to be within the spirit and scope of this invention. The above description is by ways of example only, and is not intended as limiting. The invention is only limited as defined in the following claims.

What is claimed is:

1. An audio power amplifier comprising:
    a power source terminal which receives a power source voltage;
    first and second switching transistors connected in series to said power source terminal;
    an audio signal passage which sends a pulse width modulation drive signal to said first and second switching transistors;
    a reference circuit which is connected to the power source terminal and generates a predetermined reference voltage RF;
    a capacitor which stores the reference voltage RF;
    a source voltage detection circuit which is connected to the power source terminal and generates a predetermined detected voltage DE which is proportional to the power source voltage;
    a comparator which compares the reference voltage RF and the detected voltage DE, and generates a fluctuation signal when the detected voltage DE falls below the reference voltage RF; and
    a disabling element which operates in response to the fluctuation signal to stop the operation of said first and second switching transistors.

2. The audio power amplifier according to claim 1, wherein said disabling element is a third switching transistor inserted in series to said first and second switching transistors.

3. The audio power amplifier according to claim 1, wherein said disabling element is a control block inserted in the audio signal passage 4. The audio power amplifier according to claim 3, wherein said control block comprises an AND gate having one input connected so as to receive said fluctuation signal and another input connected to receive pulse width modulation drive signal.

5. The audio power amplifier according to claim 1, wherein said 10 audio signal passage comprises a pulse width modulator and a level shifter and driver stage.

6. The audio supply amplifier according to claim 1, wherein said reference circuit comprises
    a fourth switching transistor;
    at least one resistor connected in series to the fourth switching transistor for generating the predetermined reference voltage RF; and
    a first zener diode connected in reverse direction between the power source terminal and a gate of said fourth switching transistor.

7. The audio supply amplifier according to claim 1, wherein said source voltage detection circuit comprises
    a fifth switching transistor;
    at least one resistor connected in series to the fifth switching transistor for generating the predetermined detected voltage DE; and
    a second zener diode connected in reverse direction between the power source terminal and a gate of said fifth switching transistor.

8. An audio power amplifying method comprising:
    receiving a power source voltage;
    supplying the power source voltage to first and second switching transistors;
    sending a pulse width modulation drive signal from an audio signal passage to said first and second switching transistors;
    generating a predetermined reference voltage RF using the power source voltage;
    storing the reference voltage RF by a capacitor;
    generating a predetermined detected voltage DE which is proportional to the power source voltage;
    comparing the reference voltage RF and the detected voltage DE, and generating a fluctuation signal when the detected voltage DE falls below the reference voltage RF; and stopping the operation of said first and second switching transistors in response to the fluctuation signal.

* * * * *